US007696497B2

(12) United States Patent
Rogers

(10) Patent No.: US 7,696,497 B2
(45) Date of Patent: Apr. 13, 2010

(54) FOCUSING SYSTEM AND METHOD FOR A CHARGED PARTICLE IMAGING SYSTEM

(75) Inventor: Steven Robert Rogers, D.N. Emek Sorek (IL)

(73) Assignees: Applied Materials Israel, Ltd., Rehovot (IL); Carl Zeiss AG, Oberkochen (DE)

( * ) Notice: Subject to any disclaimer, the term of this patent is extended or adjusted under 35 U.S.C. 154(b) by 0 days.

(21) Appl. No.: 11/211,355

(22) Filed: Aug. 24, 2005

(65) Prior Publication Data
US 2006/0060789 A1 Mar. 23, 2006

Related U.S. Application Data

(63) Continuation of application No. PCT/US2005/001756, filed on Jan. 20, 2005.

(60) Provisional application No. 60/540,719, filed on Jan. 29, 2004.

(51) Int. Cl.
G21K 1/08 (2006.01)
H01J 3/14 (2006.01)

(52) U.S. Cl. .......... 250/492.22; 250/305; 250/306; 250/307; 250/310; 250/311; 250/396 R; 250/396 ML; 250/492.2; 324/71.3; 324/237; 430/30

(58) Field of Classification Search .......... 250/305, 250/306, 307, 310, 311, 396 ML, 396 R, 250/492.2, 492.22; 324/71.3, 237; 430/30
See application file for complete search history.

(56) References Cited
U.S. PATENT DOCUMENTS
4,214,163 A * 7/1980 Namae et al. .......... 250/310

5,027,043 A * 6/1991 Chen et al. .......... 315/368.11
5,084,618 A 1/1992 Ito
5,483,036 A 1/1996 Giedt et al.

(Continued)

FOREIGN PATENT DOCUMENTS
EP 1 511 065 A1 3/2005

(Continued)

OTHER PUBLICATIONS

Erasmus S J, et al., "An Automatic Focusing and Astigmatism Correction System for the SEM and CTEM", Journal of Microscopy, vol. 127, No. 2, Aug. 1982, pp. 185-199, XP009055490, pp. 187-197; figures 2,4,7,9.

(Continued)

Primary Examiner—David A Vanore
(74) Attorney, Agent, or Firm—Sonnenschein Nath & Rosenthal LLP

(57) ABSTRACT

Apparatus for focusing a charged particle beam onto a surface, including a charged particle beam generator which is adapted to project the charged particle beam onto a location on the surface, thereby causing charges to be emitted from the location. The apparatus further includes an imaging detector which is adapted to receive the charges so as to form an image of the location, and an aberrating element which is positioned before the imaging detector and which is adapted to produce an aberration in the image. A processor is adapted to receive the image and to adjust at least one of the charged particle beam generator and a position of the surface in response to the aberration.

30 Claims, 6 Drawing Sheets

U.S. PATENT DOCUMENTS

| | | | | |
|---|---|---|---|---|
| 5,578,821 | A * | 11/1996 | Meisberger et al. | 250/310 |
| 5,726,919 | A | 3/1998 | Azad et al. | |
| 5,753,913 | A * | 5/1998 | Coene et al. | 250/307 |
| 6,025,600 | A | 2/2000 | Archie et al. | |
| 6,559,456 | B1 | 5/2003 | Muraki | |
| 6,661,008 | B2 * | 12/2003 | Takagi et al. | 250/310 |
| 6,765,217 | B1 * | 7/2004 | Nishimura et al. | 250/491.1 |
| 6,822,246 | B2 * | 11/2004 | Bertsche | 250/492.21 |
| 7,075,076 | B2 * | 7/2006 | Makino et al. | 250/310 |
| 2002/0088940 | A1 | 7/2002 | Watanabe et al. | |
| 2003/0001095 | A1 | 1/2003 | Lo et al. | |
| 2003/0201393 | A1 | 10/2003 | Tsuneta et al. | |
| 2006/0060789 | A1 | 3/2006 | Rogers | |

FOREIGN PATENT DOCUMENTS

| | | |
|---|---|---|
| WO | 03/041109 A2 | 5/2003 |

OTHER PUBLICATIONS

Patent Abstracts of Japan, vol. 018, No. 355 (E-1573), Jul. 5, 1994 & JP 06 096710 A (Jeol Ltd), Apr. 8, 1994 abstract; figure 1.

Ong K H et al, "Robust Focusing and Astigmatism Correction Method for the Scanning Electron Microscope", Scanning, Foundation for Advances in Medicine and Science, U.S., vol. 19, No. 8, 1997, pp. 553-563, XP00920708, ISSN: 0161-0457.

Watkinson J R, "Principles of Optical Storage-2" Electronics and Wireless World, Reed Business Publishing, Sutton, Surrey, GB, vol. 91, No. 1590, Apr. 1, 1985, pp. 43-46, XP000670563, figure 9.

International Search Report, International Patent Application No. PCT/US2005/001756, Applied Materials Israel, Ltd., Nov. 21, 2005.

Diel Glaeser Hitl & Partner; "Particle-optical Systems and Arrangements and Particle-Optical Components for Such Systems and Arrangements", Sep. 1, 2003, 182pp.

Carl Zeiss SMT AG; PCT/EP2006/008693 filed Sep. 6, 2005; International Publication No: WO 2007/028595 A2 published Mar. 15, 2007; 121pp.

* cited by examiner

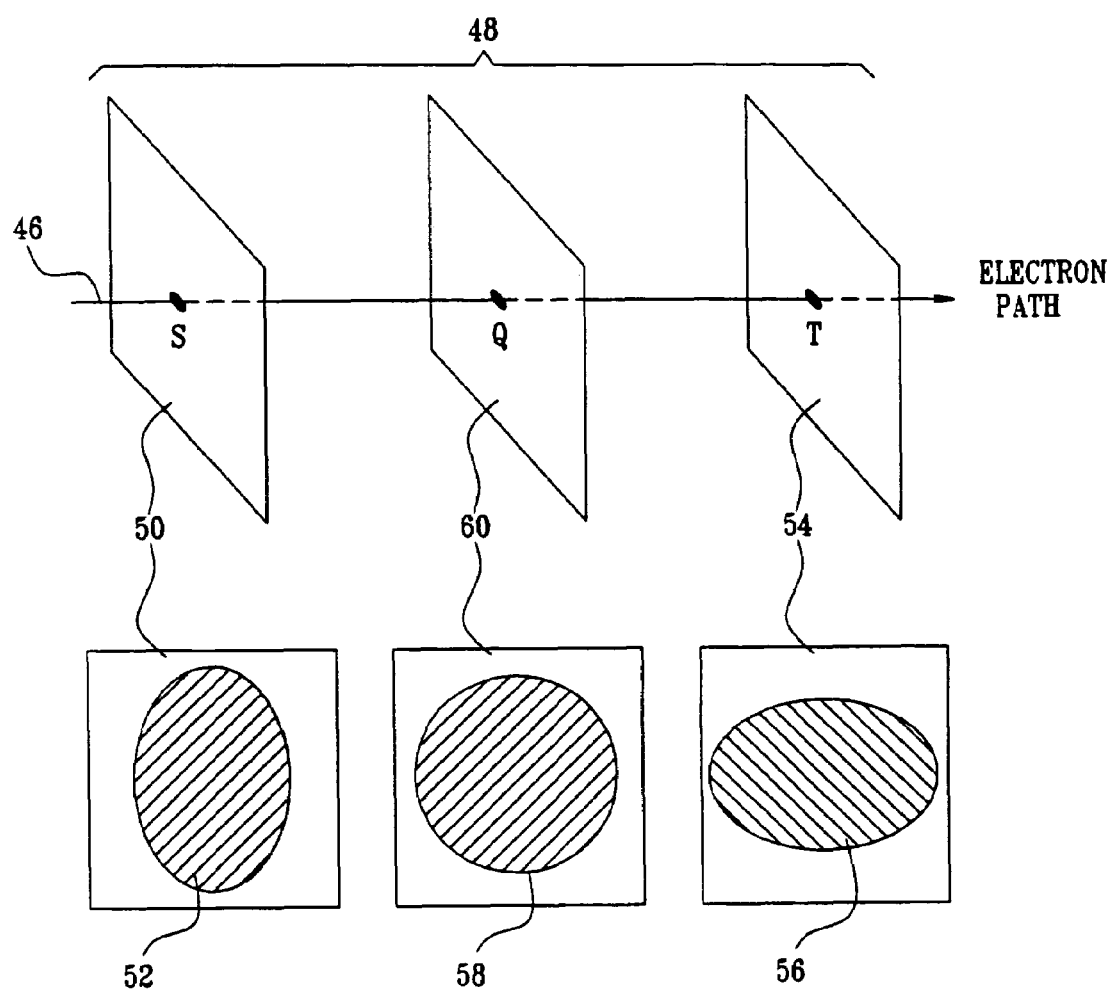

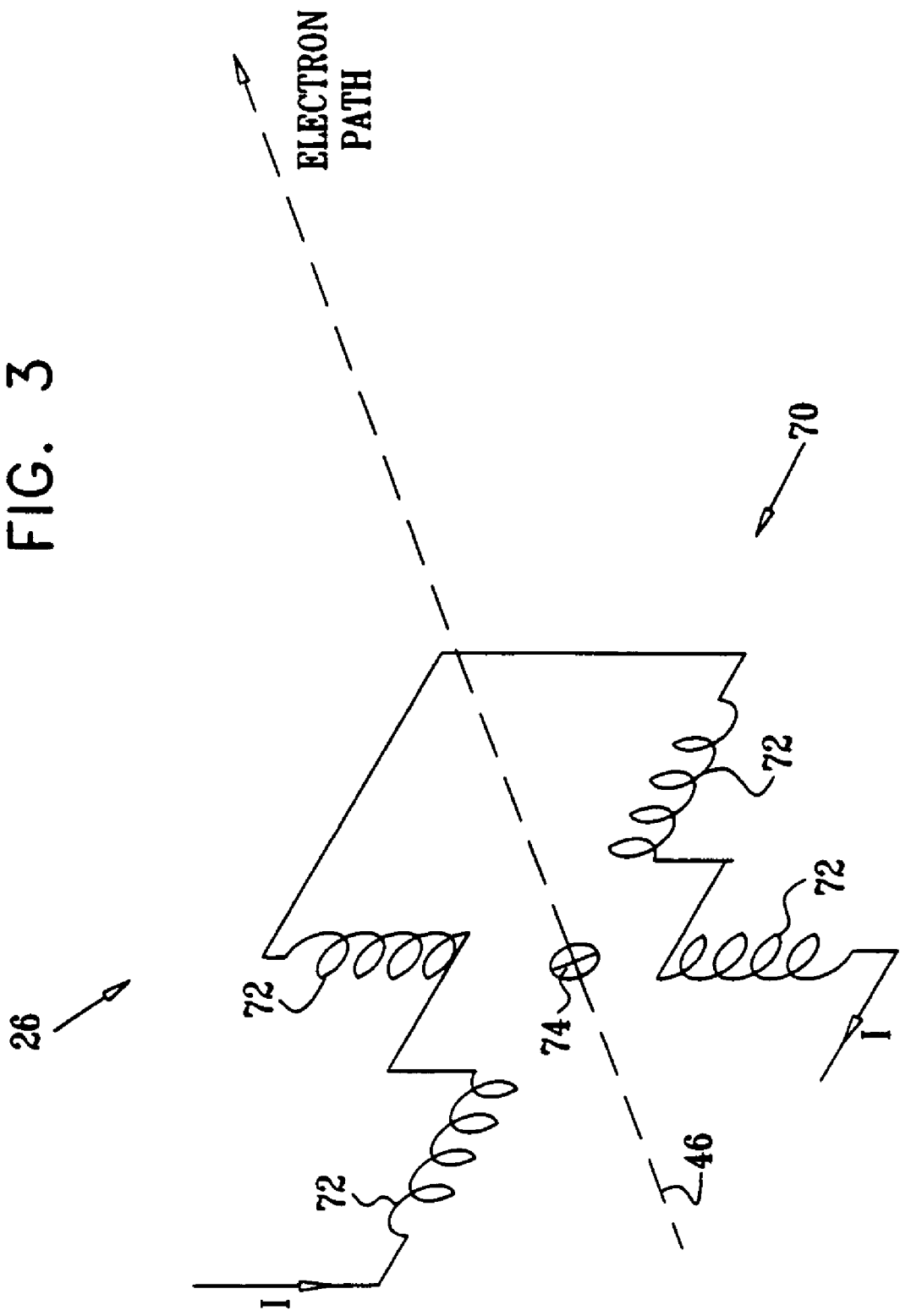

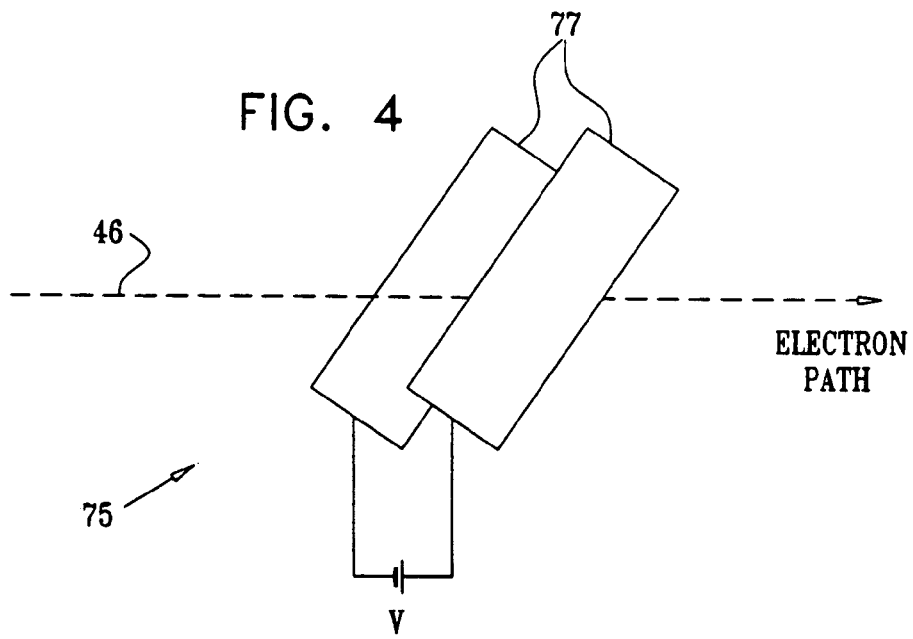
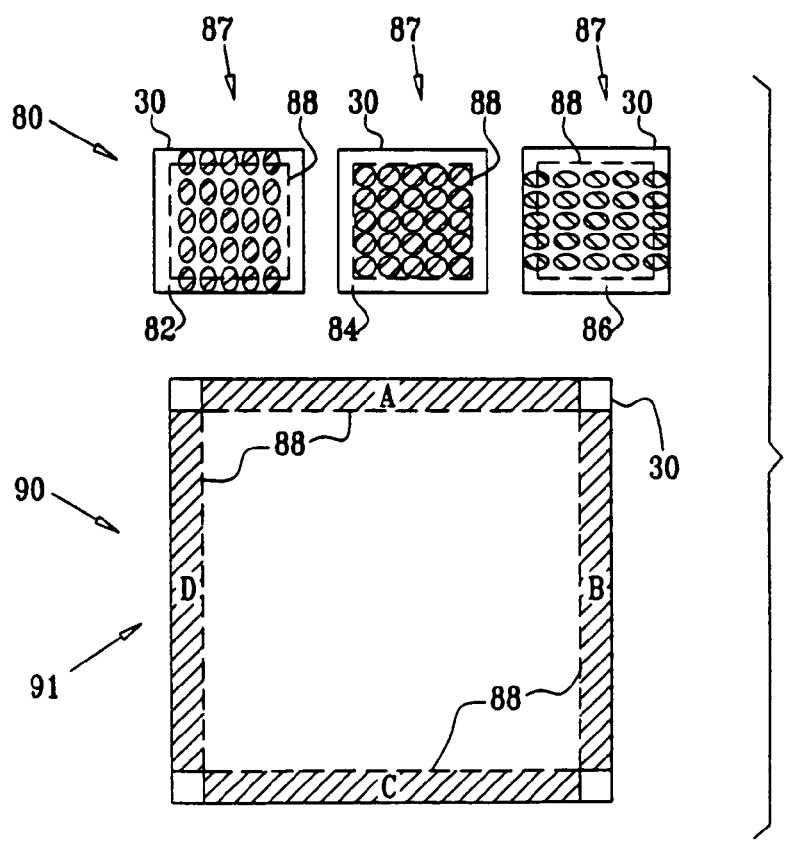

FOCUSING SYSTEM AND METHOD FOR A CHARGED PARTICLE IMAGING SYSTEM

CROSS-REFERENCE TO RELATED APPLICATION

The present patent application is a continuation of International Application No. PCT/US2005/001756 filed Jan. 20, 2005, which claims priority from Provisional Application No. 60/540,719 filed Jan. 29, 2004.

FIELD OF THE INVENTION

The present invention relates generally to focusing systems, and specifically to focusing charged particle beams.

BACKGROUND OF THE INVENTION

Charged particle beams, such as those that are used in focused ion beam or scanning electron microscopes, are typically focused by scanning the beam over a sample with sharp edges. The incident charged beam generates a scanned image of the sample, and the beam is focused by maximizing the contrast of the scanned image. However, this focusing system requires a patterned sample with sharp features.

The same method of scanning and maximizing contrast in the scanned image may also be used in wide area particle beam systems used for electron beam inspection and lithography. In these systems, in addition to the requirement for the patterned sample, this focusing method interrupts the normal wide area operation, and the scanning of the beam over the sample may introduce charging artifacts.

Other methods for focusing electron beams are known in the art. For example, U.S. Pat. No. 5,483,036, to Giedt, et al., whose disclosure is incorporated herein by reference, describes a method for automatically focusing an electron beam by determining the beam size. The beam is swept over a number of narrow slits, and the current profiles generated as the beam sweeps are used to find the beam size, and to focus the beam to an optimal position.

U.S. Pat. No. 5,726,919, to Azad, et al., whose disclosure is incorporated herein by reference, describes a system for measuring the effective focus of an electron beam. The electron beam generates a temperature profile of an irradiated target, and the temperature profile is measured optically. Beam focus operating parameters are varied until an error between the measured temperature profile and a predicted profile for an effective focus are less than a predetermined value.

In charged particle systems, astigmatism is considered a problem, and much effort has been expended to reduce the problem. For example, U.S. Patent Application 2003/0201393, to Tsuneta et al., whose disclosure is incorporated herein by reference, is directed to improving performance of an electron microscope. The disclosure describes a stigmator that is used as a compensator for astigmatic aberration, currents through the stigmator being adjusted to reduce the astigmatism of the electron microscope to zero.

U.S. Pat. No. 6,559,456, to Muraki, whose disclosure is incorporated herein by reference, describes an electron beam system. The system uses a dynamic stigmatic coil in the incoming beam path to set the astigmatism of the irradiating electron beam to be substantially equal to zero, by adjusting the blur of the focused beam to be equal in two orthogonal directions.

SUMMARY OF THE INVENTION

In an embodiment of the present invention, a charged particle generator projects a charged particle beam, typically an electron beam, onto a surface which is to be positioned so that the charged particle beam is focused on the surface. The charged particle beam causes charges to be emitted from the surface, typically secondary or back-scattered electrons. The emitted charges are conveyed over an imaging path to an imaging detector, which is able to focus the emitted charges to a focused image. An aberrating element placed before the imaging detector, typically in the imaging path, causes the detector to produce a distorted image. A processor measures the amount of aberration, and adjusts the generator and/or a position of the surface in response to the aberration.

Typically the adjustment minimizes the aberration of the distorted image. In an embodiment of the present invention the aberration comprises an astigmatism from which the processor generates an error signal. The error signal has a magnitude proportional to the amount of defocusing, and a sign which enables the processor to determine if the image is "over-focused" or "under-focused." The processor uses the error signal to adjust the generator and/or the surface position so that the distorted image does not display the astigmatism. Introducing an aberrating element into a charged beam system, and adjusting the aberration produced by the element to be a minimum, is an effective and efficient way of focusing a charged beam onto an irradiated surface. Furthermore, the focusing system does not require samples having contrast structures, can operate on bare unprocessed wafers, and does not introduce charging artifacts onto the irradiated surface.

The aberrating element typically comprises one or more electrostatic and/or magnetic elements, which divert the path of the charges passing through the element. The amount of aberration introduced by the aberrating element may be set by the processor.

The present invention will be more fully understood from the following detailed description of the embodiments thereof, taken together with the drawings, a brief description of which follows.

BRIEF DESCRIPTION OF THE DRAWINGS

FIG. 2 is a schematic illustration of the effects of introducing astigmatism into an imaging path electrons released from the system of FIG. 1, according to an embodiment of the present invention;

FIG. 3 is a schematic illustration of an aberrating element used in the system of FIG. 1, according to an embodiment of the present invention;

FIG. 4 is a schematic illustration of an aberrating element used in the system of FIG. 1, according to an alternative embodiment of the present invention;

FIG. 5 shows schematic illustrations of images formed by an imager in the system of FIG. 1, according to an embodiment of the present invention;

DETAILED DESCRIPTION OF EMBODIMENTS

Figure 1:
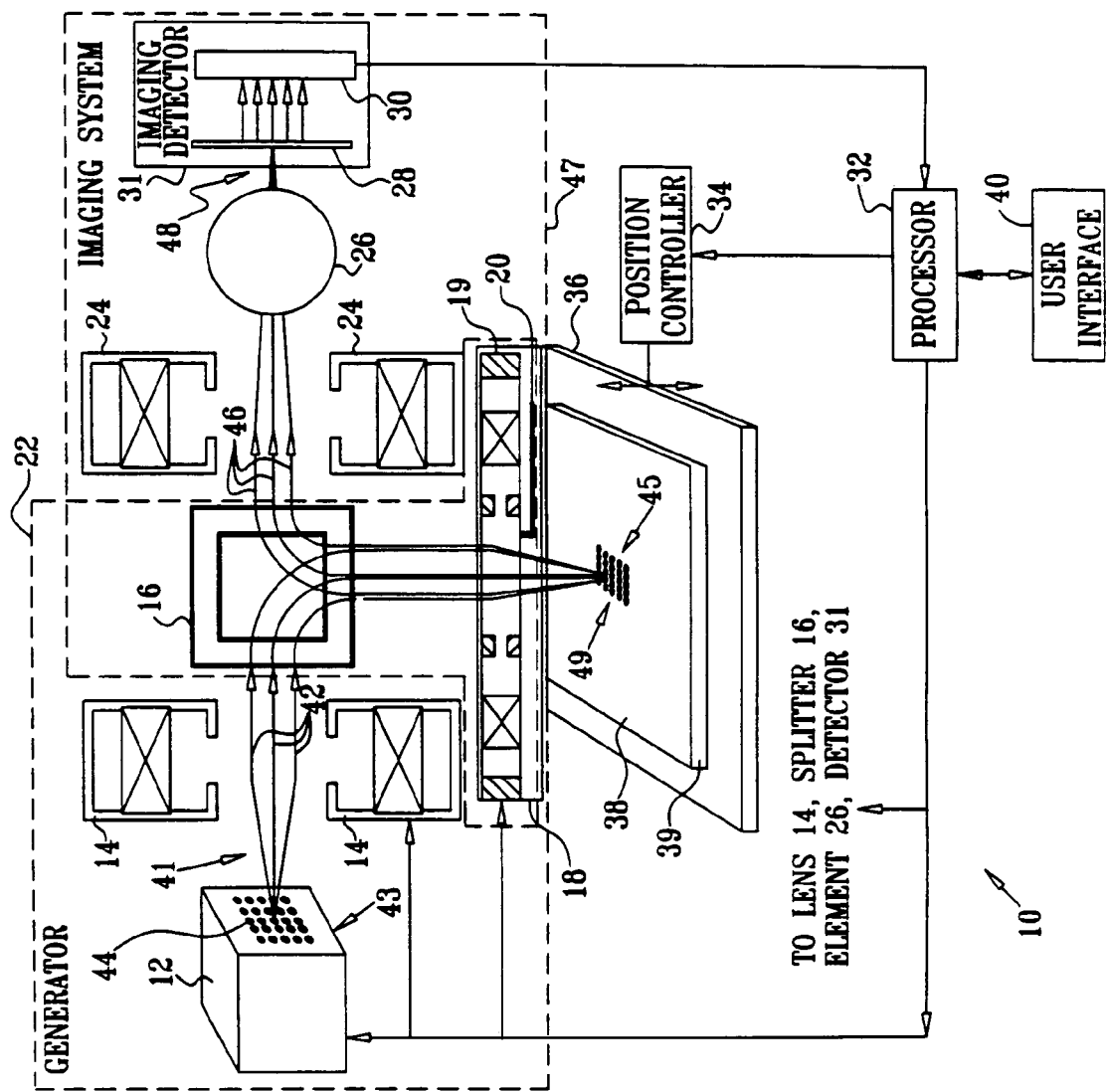
FIG. 1 is a schematic diagram of a charged particle beam focusing system, according to an embodiment of the present invention.

Reference is now made to FIG. 1, which is a schematic diagram of a charged particle beam focusing system 10, according to an embodiment of the present invention. System 10 includes a charged particle beam generator 22. By way of example, generator 22 is assumed to generate multiple charged beams 41 in parallel from a spot grid array (SGA) 44, and hereinbelow the multiple beams are assumed to comprise multiple electron beams, generated by a charged particle gun 12, which is herein assumed to be a multiple electron beam gun. By way of example, except where otherwise stated it is assumed that array 44 is a generally rectangular array aligned with horizontal and vertical axes. It will be appreciated, however, that the scope of the present invention is not limited to a particular type or alignment of SGA 44, and includes substantially all types and alignments of such arrays.

It will also be appreciated that the scope of the present invention is not limited to focusing a particular type of charged particle, and includes substantially all types of charged particles, including ions such as Gallium or other metallic ions. Furthermore, while the description hereinbelow is drawn to a multiple source charged particle system by way of example, it will be understood that the principles of the present invention apply to focusing charged particles from a single source.

Generator 22 comprises one or more illumination lenses 14, a beam splitter 16, and an objective lens 18. Typically, the one or more lenses 14 and beam splitter 16 operate magnetically, although the lenses and/or the beam splitter may also incorporate other types of operation, such as electrostatic operation. Objective lens 18 may advantageously be a retarding lens, comprised of a magnetic portion 19 and an electrostatic portion 20.

Particle gun 12 generates the multiple electron beams of SGA 44 from respective substantially circular sources 43, each of the beams following irradiation paths 42 through generator 22 to a surface 38 of a specimen 39, which is mounted on a movable stage 36. For clarity, an irradiation path 42 from only one source 43 is illustrated in FIG. 1, but it will be understood that generally similar irradiation paths 42 are followed by the electron beams from the other originating sources 43 of SGA 44. The one or more lenses 14, beam splitter 16, and objective lens 18 form respective generally circular images 45, hereinbelow referred to as spots 45, of sources 43 on surface 38. Individual spots 45 are contained within an array 49, which is an image of SGA 44 formed on surface 38.

Each spot 45 generates reflected, secondary, and/or backscattered electrons, and these electrons, which in the specification and in the claims are also termed released electrons, pass through objective lens 18, and beam splitter 16. The released electrons from each spot 45 follow imaging paths 46, via an imaging lens 24 and an aberrating element 26, to an electron detector 28. For clarity, an imaging path 46 from only one spot 45 is illustrated in FIG. 1, but it will be understood that generally similar imaging paths 46 are followed by the released electrons from the other spots 45.

Electron detector 28, typically a phosphor screen, converts the released electrons to optical radiation, which is imaged by an imager 30, such as a charge coupled detector (CCD) array. Detector 28 and imager 30 are typically combined as one unit, and act as an imaging detector 31 of the released electrons. Alternatively, imaging detector 31 may comprise an avalanche photodiode array, which directly detects the released electrons without conversion to light. Typically, the axes of imager 30 align with those of array 44. Lenses 18 and 24, beam splitter 16, aberrating element 26, and imaging detector 31 comprise an imaging system 47 for system 10. The image generated by imaging system 47 is transferred to a processor 32, which analyzes the image. As described in more detail below, in response to the analysis, processor 32 adjusts the focus of spots 45 to be optimal.

Processor 32 is coupled to gun 12, lenses 14, beam splitter 16, objective lens 18, imaging lens 24, aberrating element 26, and imaging detector 31, so as to control their operation, and to act as an overall controller of system 10. For example, processor 32 may adjust the excitation of magnetic portion 19 of lens 18, and/or the energy of the beam output from generator 22. Typically, processor 32 receives operating parameters from an operator of the system via a user interface 40, which enables the operator to adjust settings of the system components described above, as well as other components of system 10 described below. Processor 32 is also coupled to, and operates, a position controller 34. Under command of the processor, controller 34 is able to adjust stage 36 in a vertical direction.

Aberrating element 26 introduces an aberration into the images of spots 45 produced by imaging system 47, the distorted images typically being formed in a region 48 after the element. The aberration typically comprises an astigmatism, so that each spot 45 is imaged in two different focal planes orthogonal to the path of the electrons, each plane comprising a different ellipse to which the released electrons are focused.

FIG. 2 is a schematic illustration of the effects of introducing astigmatism into imaging path 46 of the released electrons, according to an embodiment of the present invention. For clarity, neither aberrating element 26 nor detector 28 are shown in FIG. 2, which illustrates images formed in region 48, and respective positions of the images in the region, from one of spots 45. Aberrating element 26 focuses the released electrons to a first focal plane 50, forming a first elliptical image 52 in the plane, which is at a position S in path 46. The electrons continue to a second focal plane 54, wherein the released electrons form a second elliptical image 56. Plane 54 is at a position T in path 46. The two elliptical images have major axes which are orthogonal to each other, and the axes are herein assumed to be generally vertical and horizontal. Distance ST provides a metric of the aberration introduced into system 10 by element 26, and other metrics that may be used to quantify a size of the aberration will be apparent to those skilled in the art. Between planes 50 and 54, imaging system 47 images the released electrons to a generally circular image 58, generated in a plane 60 parallel to planes 50 and 54, and positioned at a position Q between S and T.

FIG. 3 is a schematic illustration of aberrating element 26, according to an embodiment of the present invention. Element 26 is formed as a quadrupole lens 70, constructed from four generally similar magnetic coils 72 connected in series, so that a current I flowing through the lens generates four similar poles (four norths or four souths) facing across a center point 74. Quadrupole lenses such as lens 70 are used in the electron microscope art as a stigmator for correcting axial astigmatism present in an electron microscope. In system 10, coils 72 are positioned generally symmetrically about imaging path 46, and processor 32 varies current I flowing through the coils. Increase of current I increases the aberration generated by lens 70.

FIG. 4 is a schematic illustration of aberrating element 26, according to an alternative embodiment of the present invention. In this alternative example of aberrating element 26, the element is formed as a capacitor 75. Ordinarily, capacitor 75 is formed from parallel plates 77, which are aligned so that imaging path 46 makes a non-zero angle with the plane of symmetry of the capacitor. The aberration introduced by capacitor 75 is typically proportional to an electric field generated by a voltage V between plates 77, which can be adjusted by processor 32.

It will be understood that lens 70 and capacitor 75 are examples of aberrating elements that may be used for aberrating element 26, and other systems for producing aberration will be apparent to those skilled in the art. Such systems include, but are not limited to, pluralities of quadrupole lenses and/or capacitors, one or more electrostatic lenses, one or more magnetic lenses other than quadrupole lenses, electrical, magnetic, and electromagnetic devices, as well as combinations and sub-combinations of such lenses and devices. All such systems are assumed to be included within the scope of the present invention.

FIG. 5 shows schematic illustrations of the images formed by imager 30, according to an embodiment of the present invention. Imager 30 forms an array of images, each of which is herein referred to generically as an image 80. Each image 80 corresponds to a respective source 43, and to one of the spots 45. The shape of each image 80 depends, inter alia, on the amount of aberration introduced by element 26, as well as on the position of detector 28 in imaging path 46. Typically, for any specific position of the detector, each image 80 has generally the same shape.

Diagrams 82, 84, and 86 show respective images 83, 85, and 87, of array 49, formed on imager 30 in respective positions S, Q, and T (FIG. 2), and it is assumed for the purposes of example that position Q is the position at which minimal aberration of images 80 occurs. The aberration occurring at other positions, such as positions S and T, may be quantified by using boundaries 88 of the images of diagram 84 as baselines, and finding areas of the images at the other positions which are not bounded by the boundaries. Baseline boundaries 88 have also been drawn on diagrams 82 and 86. A diagram 90 illustrates an arrangement 91 of areas A, B, C, and D, of imager 30 which generate respective signals S(A), S(B), S(C), and S(D). In diagram 82 signals S(A) and S(C) are greater than S(B) and S(D); in diagram 86 signals S(A) and S(C) are less than S(B) and S(D).

An expression for an error signal generated by processor 32, using the areas A, B, C, and D of imager 30, is given by equation (1):

$$ERR = S(A) + S(C) - S(B) - S(D) \tag{1}$$

where ERR represents the value of a focus error signal generated by processor 32, and S(A), S(B), S(C), and S(D) are generated from areas A, B, C, and D respectively.

Applying equation (1) to diagrams 82, 84, and 86, by inspection ERR is respectively positive, approximately zero, and negative. It will be appreciated that there is a direct relation between the magnitude and sign of ERR, the aberration produced at imaging detector 31, and whether spots 45 are "under-focused," in-focus, or "over-focused."

Returning to FIG. 1, processor 32 uses the value of ERR to optimize the focusing of spots 45. Typically, processor 32 adjusts the vertical displacement of stage 36 using controller 34. Alternatively or additionally, the processor adjusts the incoming charged beam, for example by altering a potential applied to gun 12, and/or by altering a current through the one or more lenses 14. Processor 32 makes the adjustments, using the magnitude and the sign of ERR, to minimize the absolute value of ERR.

Figure 6:
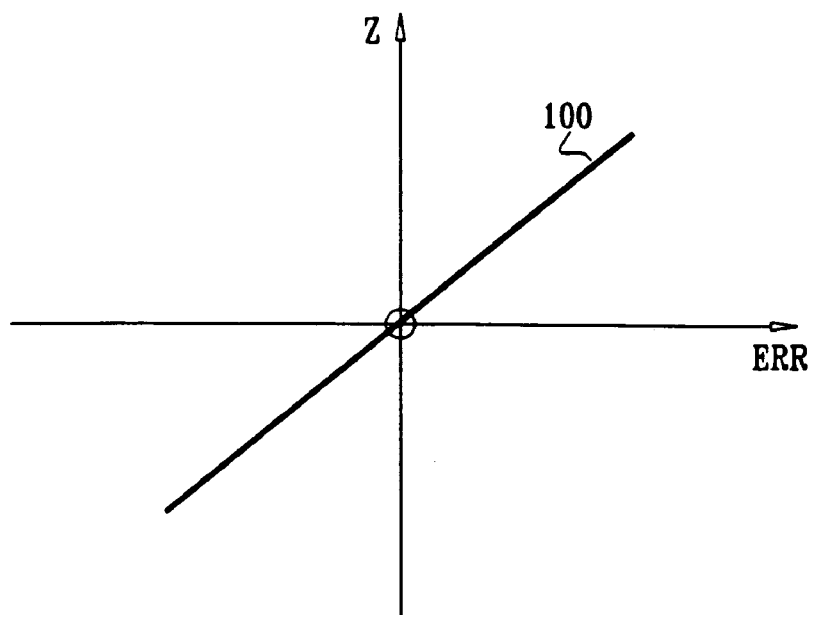
FIG. 6 is a schematic graph of a displacement of a position stage versus an error signal, according to an embodiment of the present invention.

FIG. 6 is a schematic graph 100 of vertical displacement z of stage 36 vs. ERR, according to an embodiment of the present invention. Graph 100 illustrates the vertical displacement z implemented by processor 32, if the processor makes adjustments to the focus of spots 45 by using stage 36. Typically, the relation between z and ERR is approximately linear, and the two parameters are approximately directly proportional. Actual values of z and ERR corresponding to graph 100 may be determined in a calibration phase applied to system 10. During a production phase applied to specimen 39, processor 32 then acts as a feedback control for position controller 34, using the values from the calibration phase to focus spots 45 optimally, i.e., to bring ERR to a value equal or close to zero. Typically, the processor 32 achieves the optimal focus by iteratively activating controller 34. Alternatively, processor 32 may be configured to act as an iterative feedback control for controller 34 without prior determination of values of z and ERR corresponding to graph 100.

It will be appreciated that aberrating element 26 may be configured to introduce aberrations comprising aberrations other than those exemplified above, such as third-order field distortion, into the image produced by system 10. As described above, mutatis mutandis, imaging detector 31 in conjunction with processor 32 generates a measure of the introduced aberration, and processor 32 uses the measure to adjust the focus of spots 45. Thus, the scope of the present invention includes all aberrating elements and aberrations that are able to provide a measure of the introduced aberration for use in adjusting the focus of spots 45.

Figure 7:
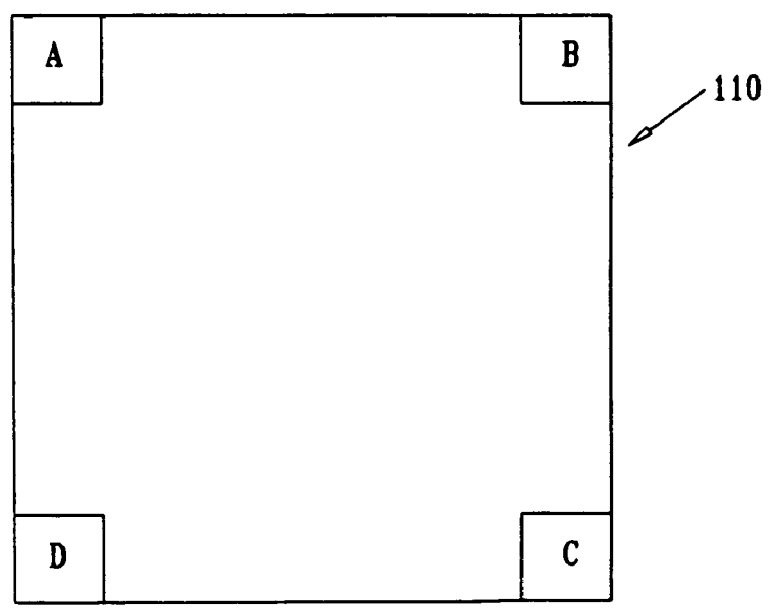
FIG. 7 is an example of an alternative to the images of FIG. 5, according to an embodiment of the present invention.

Returning to FIG. 4, the shape and/or position of areas A, B, C, and D on imager 30 may be adjusted according to the type of aberration generated by element 26, as exemplified by the following description with respect to FIG. 7.

FIG. 7 is an example of an alternative arrangement 110 of areas A, B, C, and D, according to an embodiment of the present invention. Arrangement 110 of the areas on imager 30 may advantageously be used if images 83, 85, and 87, and/or if the ellipses generated as described above with reference to FIG. 2, have their axes at 45° to the horizontal and vertical. In these cases, it will be appreciated that equation (1) still applies.

Unlike prior art focusing systems, embodiments of the present invention work in parallel with normal operation of a system within which they are operative. For example, when used in a scanning electron microscope (SEM), there is no requirement to interrupt the SEM's operation by making a "focus ramp" or by searching for an optimal contrast in the SEM. Since there is no requirement for sample contrast whatsoever, embodiments of the present invention can even work on bare wafers. Furthermore, since no scanning is used, there are no charging artifacts generated.

While the examples described above have assumed that aberrating element 26 is positioned in imaging path 46, it will be appreciated that the element may be located in substantially any position before detector 31. Those skilled in the art will be able to make necessary adjustments to the operation of system 10 to accommodate other positions for element 26. For example, element 26 may be located on irradiation path 42, and operation of the element may cause an increase in focused spot size on surface 38. The effects of such an increase may be compensated for by methods known in the art, such as a repeated scan of surface 38 or an adjustment to lens 18. Thus, all positions for element 26 before detector 31 are assumed to be included within the scope of the present invention.

Figure 8:
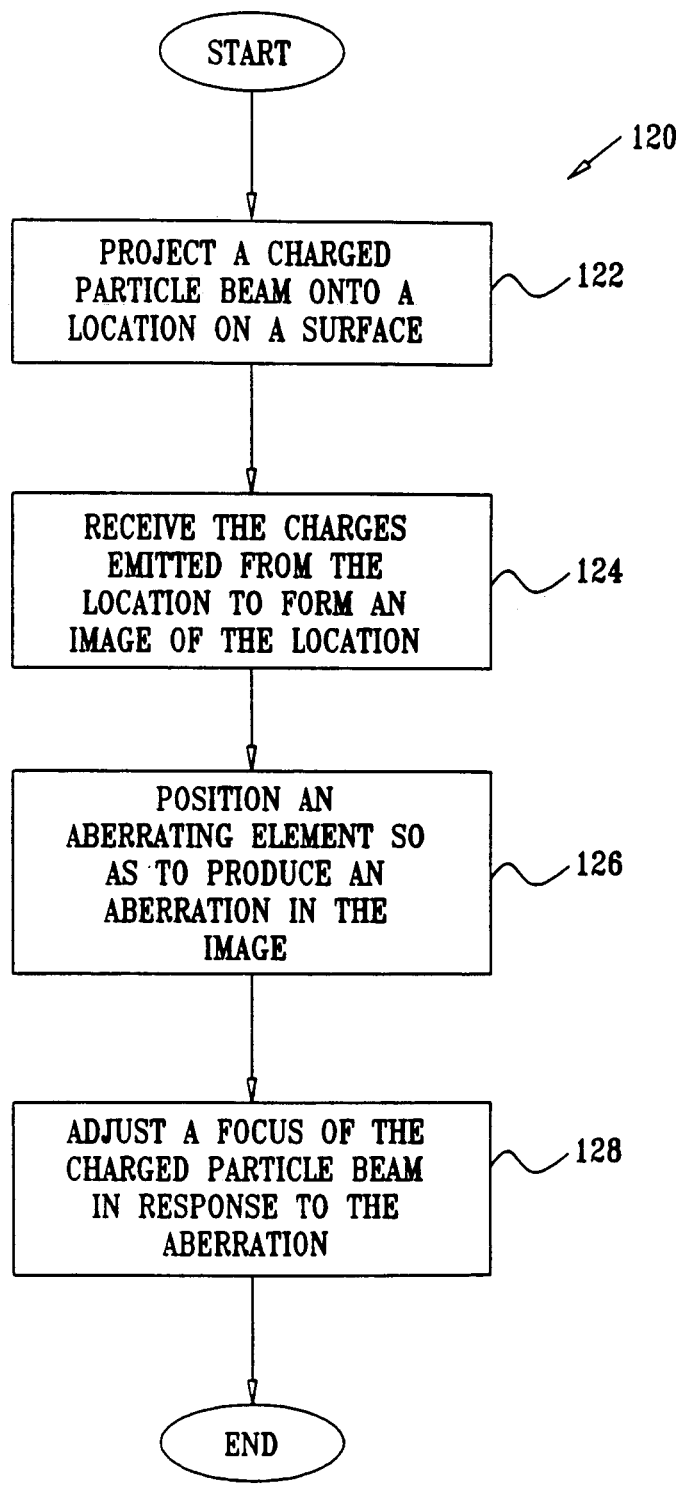
FIG. 8 is a flow chart showing steps involved in a process for focusing a charged particle beam onto a surface, according to an embodiment of the invention.

FIG. 8 is a flow chart showing steps involved in a process 120 for focusing charged particle beam 41 onto surface 38 (FIG. 1), according to an embodiment of the invention. While the flow chart shows the steps as sequential, it will be understood that there is no temporal relation between the steps, and that actions of all of the steps typically occur substantially simultaneously.

In an initial step 122, charged particle beam 41 is projected onto a location on surface 38, thus causing charges, typically secondary electrons, to be emitted from the location.

In a second step 124, the charges emitted from the location are received so as to form an image of the location. The charges are usually received in an imager such as imager 30.

In a third step 126 aberrating element 26 has been positioned so as to produce an aberration in the image, typically by being located in imaging path 46.

In a final step 128 of process 120, a processor adjusts a focus of the charged particle beam in response to the aberration. The adjustment may typically be made by adjusting at least one of a generator forming beam 41 and a position of surface 38.

It will be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

I claim:

1. Apparatus, comprising:
   a charged particle beam generator adapted to project a charged particle beam onto a location on a surface of a specimen so as to form an array of spots on the location, thereby causing released electrons to be emitted from the location;
   an imaging detector adapted to receive the released electrons via an imaging path from the surface of the specimen to the imaging detector and to form an image of the location from said released electrons;
   an aberrating element positioned in the imaging path between the specimen and the imaging detector and adapted to produce an aberration in the image; and
   a processor adapted to
      generate, from the aberration, a focus error signal; and,
      in response to said focus error signal, adjust at least one of the charged particle beam and a position of the surface so as to minimize an absolute value of a magnitude of the focus error signal.

2. The apparatus according to claim 1, wherein the released electrons emitted from the location comprise reflected, secondary and/or back-scattered electrons.

3. The apparatus according to claim 1, wherein the charged particle beam comprises at least one of a beam of electrons and a beam of ions.

4. The apparatus according to claim 1, wherein the charged particle generator is adapted to project the charged particle beam via an irradiation path to the location, the imaging path being different from the irradiation path.

5. The apparatus according to claim 4, wherein the charged particle beam generator comprises at least one element chosen from a charged particle gun, an illumination lens, a beam splitter, and an objective lens, and wherein the irradiation path comprises a path through the at least one element.

6. The apparatus according to claim 1, wherein the aberrating element comprises a stigmator, and wherein the aberration comprises an astigmatism.

7. The apparatus according to claim 1, wherein the processor is adapted to focus the charged particle beam by adjusting at least one of the charged particle beam generator and the position of the surface.

8. The apparatus according to claim 1, wherein the processor is adapted to adjust a size of the aberration.

9. A method, comprising:
   projecting a charged particle beam onto a location on a surface of a specimen, thereby causing released electrons to be emitted from the location;
   in an imaging path between the specimen and an imaging detector, passing the released electrons emitted from the location through an aberrating element;
   receiving, via the imaging path and at the imaging detector, the released electrons emitted from the location and forming an image of the location therefrom, said image having an aberration produced by the aberrating element;
   generating, from the aberration, a focus error signal; and
   adjusting, in response to said focus error signal, at least one of the charged particle beam and a position of the surface so as to minimize an absolute value of a magnitude of the focus error signal.

10. The method according to claim 9, wherein the released electrons emitted from the location comprise reflected, secondary and/or back-scattered electrons.

11. The method according to claim 9, wherein the charged particle beam comprises at least one of a beam of electrons and a beam of ions.

12. The method according to claim 9, wherein projecting the charged particle beam comprises projecting the charged particle beam via an irradiation path to the location, the imaging path being different from the irradiation path.

13. The method according to claim 12, wherein projecting the charged particle beam comprises projecting the charged particle beam via a charged particle beam generator comprising at least one element chosen from a charged particle gun, an illumination lens, a beam splitter, and an objective lens, and wherein the irradiation path comprises a path through the at least one element.

14. The method according to claim 9, wherein the aberrating element comprises a stigmator, and wherein passing the charges emitted from the location through the aberrating element comprises creating an astigmatism in the image.

15. The method according to claim 9, wherein projecting the charged particle beam comprises projecting the charged particle beam from a charged particle beam generator, and wherein adjusting the focus comprises adjusting at least one of the charged particle beam and a position of the surface.

16. The method according to claim 9, and comprising adjusting the aberrating element so as to adjust a size of an aberration in the image.

17. Apparatus, comprising:
   a charged particle beam generator adapted to project a charged particle beam onto a location on a surface of a specimen, thereby causing released electrons to be emitted from the location;
   an imaging detector adapted to receive the released electrons via an imaging path from the surface of the specimen to the imaging detector and to form an image of the location from said released electrons;

an aberrating element positioned in the imaging path between the specimen and the imaging detector and adapted to produce an aberration in the image; and a processor adapted to generate, from the aberration, a focus error signal; and, in response to said focus error signal, adjust at least one of the charged particle beam and a position of the surface so as to minimize an absolute value of a magnitude of the focus error signal.

18. The apparatus according to claim 17, wherein the released electrons emitted from the location comprise reflected, secondary and/or back-scattered electrons.

19. The apparatus according to claim 17, wherein the charged particle beam comprises at least one of a beam of electrons and a beam of ions.

20. The apparatus according to claim 17, wherein the charged particle generator is adapted to project the charged particle beam via an irradiation path to the location, the imaging path being different from the irradiation path.

21. The apparatus according to claim 20, wherein the charged particle beam generator comprises at least one element chosen from a charged particle gun, an illumination lens, a beam splitter, and an objective lens, and wherein the irradiation path comprises a path through the at least one element.

22. The apparatus according to claim 17, wherein the aberrating element comprises a stigmator, and wherein the aberration comprises an astigmatism.

23. The apparatus according to claim 17, wherein the processor is adapted to focus the charged particle beam by adjusting at least one of the charged particle beam generator and the position of the surface.

24. A method, comprising:

projecting a charged particle beam onto a location on a surface of a specimen, thereby causing released electrons to be emitted from the location;

in an imaging path between the specimen and an imaging detector, passing the released electrons emitted from the location through an aberrating element;

receiving, via the imaging path and at the imaging detector, the released electrons emitted from the location and forming an image of the location therefrom, said image having an aberration produced by the aberrating element;

generating, from the aberration, a focus error signal;

adjusting, in response to said focus error signal, at least one of the charged particle beam and a position of the surface so as to minimize an absolute value of a magnitude of the focus error signal.

25. The method according to claim 24, wherein the released electrons emitted from the location comprise reflected, secondary and/or back-scattered electrons.

26. The method according to claim 24, wherein the charged particle beam comprises at least one of a beam of electrons and a beam of ions.

27. The method according to claim 24, wherein projecting the charged particle beam comprises projecting the charged particle beam via an irradiation path to the location, the imaging path being different from the irradiation path.

28. The method according to claim 27, wherein projecting the charged particle beam comprises projecting the charged particle beam via a charged particle beam generator comprising at least one element chosen from a charged particle gun, an illumination lens, a beam splitter, and an objective lens, and wherein the irradiation path comprises a path through the at least one element.

29. The method according to claim 24, wherein the aberrating element comprises a stigmator, and wherein passing the charges emitted from the location through the aberrating element comprises creating an astigmatism in the image.

30. The method according to claim 24, wherein projecting the charged particle beam comprises projecting the charged particle beam from a charged particle beam generator, and wherein adjusting the focus comprises adjusting at least one of the charged particle beam and a position of the surface.

* * * * *